United States Patent
Takahashi

(10) Patent No.: US 6,739,704 B2
(45) Date of Patent: May 25, 2004

(54) PIEZOELECTRIC TRANSDUCER AND INK EJECTOR USING PIEZOELECTRIC TRANSDUCER

(75) Inventor: Yoshikazu Takahashi, Nagoya (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 140 days.

(21) Appl. No.: 10/075,452

(22) Filed: Feb. 15, 2002

(65) Prior Publication Data
US 2002/0140783 A1 Oct. 3, 2002

(30) Foreign Application Priority Data
Mar. 29, 2001 (JP) .................................. 2001-096423

(51) Int. Cl.[7] .............................................. B41J 2/45
(52) U.S. Cl. ................................................. 347/72
(58) Field of Search .................... 347/68–72; 310/365, 310/366

(56) References Cited

U.S. PATENT DOCUMENTS 4,825,227 A * 4/1989 Fischbeck et al. ............ 347/69
5,266,964 A * 11/1993 Takahashi et al. ............ 347/72
5,402,159 A    3/1995 Takahashi et al.
6,174,051 B1   1/2001 Sakaida

* cited by examiner

Primary Examiner—Judy Nguyen
(74) Attorney, Agent, or Firm—Oliff & Berridge, PLC

(57) ABSTRACT

In a piezoelectric transducer, first piezoelectric ceramic layers are laminated on second piezoelectric ceramic layers, which are placed over an array of ink channels. In the first piezoelectric ceramic layers, two areas defined, corresponding to each ink channel, by a column of positive electrodes and two columns of negative electrodes are polarized symmetrically in a direction perpendicular to the laminating direction. In the second piezoelectric ceramic layers, each area defined by positive and negative electrodes are polarized parallel to the laminating direction. Upon the application of a voltage between the positive and negative electrodes in the first and second piezoelectric layers, corresponding to a selected ink channel, the two polarized areas in the first piezoelectric ceramic layers extend in the ink channel array direction while each polarized area in the second piezoelectric ceramic layers contracts in the ink channel array direction. Such a bimorph deformation increases the volume of the ink channel.

34 Claims, 7 Drawing Sheets

PIEZOELECTRIC TRANSDUCER AND INK EJECTOR USING PIEZOELECTRIC TRANSDUCER

BACKGROUND OF THE INVENTION

1. Field of Invention

The invention relates to a piezoelectric transducer and an ink ejector using a piezoelectric transducer.

2. Description of Related Art

A piezoelectric ink ejector has been conventionally proposed for a printhead. In a drop-on-demand ink ejector, a piezoelectric transducer deforms to change the volume of an ink channel containing ink. Ink in the ink channel is ejected from a nozzle when the volume is reduced, while ink is drawn into the ink channel when the volume is increased. Typically, a number of such ink ejecting mechanisms are disposed adjacent to each other, and ink is selectively ejected from an ink ejecting mechanism located in a particular position to form desired characters and graphics.

In a conventional piezoelectric ink ejector, one piezoelectric transducer is used for each ink ejecting mechanism. In this case, if a number of ink ejecting mechanisms are clustered to form an image over a wide range at high resolution, the ink ejector becomes complicated in structure and expensive to manufacture. In addition, it is hard to downsize each ejecting mechanism because the piezoelectric transducer cannot be made smaller due to machining constraints. Thus, the resolution is limited in such an ink ejector.

To address the forgoing problems, a single piezoelectric transducer disposed across a plurality of ink channels has recently been proposed for a piezoelectric ink ejector. A portion of the single piezoelectric transducer corresponding to a particular ejecting mechanism is locally deformed.

Such a piezoelectric ink ejector is disclosed in U.S. Pat. No. 6,174,051. A piezoelectric transducer of the disclosed ink ejector has, as shown in FIG. 7, an ink insulating layer 40 contacting the ink in ink channel 31, a piezoelectric ceramic layer 34 stacked on the ink insulating layer 40, and laminated piezoelectric ceramic layers 33 stacked on the piezoelectric ceramic layer 34. All of these layers 40, 34, 33 are polarized in a direction in which these layers 40, 34, 33 are laminated, as indicated by arrows E. An outer electrode 38 is provided over an upper surface of the ink insulating layer 40 and is connected to a negative terminal of a drive power source. First inner electrodes 36 are provided on an upper surface of each of the piezoelectric ceramic layers 33, 34, corresponding to each ink channel 31 and are connected to a positive terminal of the actuating power source. Second inner electrodes 37 are provided on an upper surface of each of the piezoelectric ceramic layers 33, 34, corresponding to each partition wall 35 and are connected to the negative terminal of the actuating power source.

Upon the application of a voltage to the first inner electrodes 36 corresponding to a selected ink channel 31 according to print data, an electric field is generated perpendicularly to the polarization direction, as indicated by arrows G, between the first and second inner electrodes 36, 37, and the piezoelectric ceramic layers 33 are deformed in a shear mode. At the same time, an electric field is generated in the same direction as the polarization direction, as indicated by arrows H, between the first inner electrodes 36 and the outer electrode 38, and the piezoelectric ceramic layer 34 is deformed in an extensional mode. As a result, a portion of the piezoelectric transducer corresponding to the selected ink channel 31 is deformed by a bimorph effect to increase the volume of the ink channel 31.

Thereafter, when the voltage is disconnected, the portion deformed returns to its original state to reduce the volume of the ink channel 31, thereby ejecting the ink from a nozzle (not shown).

The ink ejector structured as described above is easy and inexpensive to manufacture and able to accomplish high-resolution printing. However, in the piezoelectric transducer of the above-described ink ejector, a drive voltage is applied to the piezoelectric ceramic layers 33 in a direction different from the polarization direction repeatedly for ink ejection, and thus the polarization property tends to deteriorate. As a result, deformation of the piezoelectric transducer becomes unstable, ink ejection becomes inaccurate, and print quality is reduced.

SUMMARY OF THE INVENTION

The invention provides an improved piezoelectric transducer that can be effectively deformed upon receipt of even a low voltage without deterioration in the polarization property. The invention also provides an ink ejector that can eject a large droplet at high speed.

According to one aspect of the invention, a piezoelectric transducer includes a first piezoelectric ceramic layer and a second piezoelectric ceramic layer laminated to the first piezoelectric layer. A first electrodes set including a plurality of electrodes is provided spacedly for the first piezoelectric ceramic layer perpendicularly to a laminating direction of the first and second piezoelectric ceramic layers, and the first electrodes set defines therebetween at least a first area polarized perpendicularly to the laminating direction. A second electrodes set including a plurality of electrodes positioned in the second piezoelectric ceramic layer spacedly in the laminating direction, and the second electrodes set defining at least a second area polarized parallel to the laminating direction. At least a second area is, aligned in the laminating direction with the at least a first area.

Upon application of a voltage to the first electrodes set and to the second electrodes set, an electric field is generated in the polarization direction in each of the at least a first area and the at least a second area. As a result, at least a first area extends by a longitudinal effect perpendicularly to the laminating direction, and at least a second area contracts by a transversal effect perpendicularly to the laminating direction.

The first piezoelectric ceramic layer locally extends while the second piezoelectric ceramic layer locally contracts. The piezoelectric transducer is locally deformed effectively by such a bimorph effect produced upon the application of even a low voltage.

BRIEF DESCRIPTION OF THE DRAWINGS

A preferred embodiment of the invention will be described in detail with reference to the following figures wherein.

In all of the figures, like elements are labeled with like numbers. The figures are not drawn to scale.

DETAILED DESCRIPTION OF PREFERRED EMBODIMENTS

One embodiment of the invention as a piezoelectric transducer and an ink ejector will be described with reference to FIGS. 1 through 6.

Figure 1:
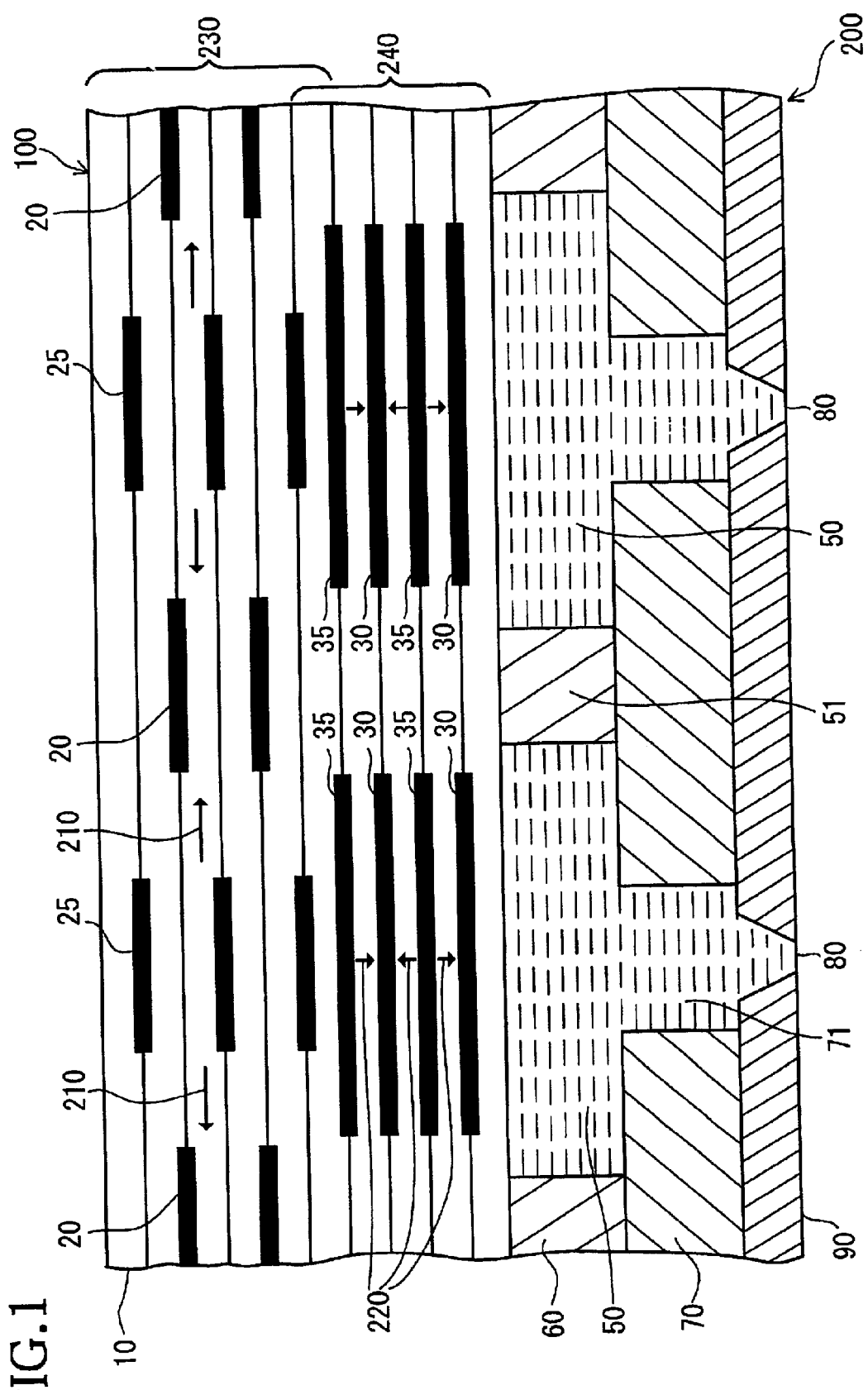
FIG. 1 is a cross-sectional view of an ink ejector according to one embodiment of the invention.

FIG. 1 shows a cross-sectional view of a plurality of ink ejecting mechanisms taken in the direction of an array of the ink ejecting mechanisms (hereinafter referred to as "array direction"). An ink ejector 200 includes a piezoelectric transducer 100, an ink channel forming member 60, a spacer member 70, and a nozzle plate 90 having nozzles 80.

Ink channels 50, each containing ink, are defined by openings formed in the ink channel forming member 60. The piezoelectric transducer 100 covers the openings from the top, and the spacer member 70 partially covers the openings from the bottom (in the top to bottom rendering of FIG. 1). Each ink channel measures 0.375 mm in width (in a right-left direction in FIG. 1) and 2.000 mm in length (in a direction perpendicular to the sheet of FIG. 1). A plurality of ink channels are arranged with 0.508 mm pitches (50 dpi) in the array direction. Each ink channel 50 is connected, at one end, to an associated nozzle 80 formed in the nozzle plate 90 through a connecting hole 71 formed in the spacer member 70 and, at the other end, to an ink supply device (not shown).

The piezoelectric transducer 100 is made of a piezoelectric ceramic material of lead zirconate titanate (PZT) group. The piezoelectric transducer 100 includes piezoelectric ceramic layers 10 having a piezoelectric effect and an electrostrictive strain effect and a plurality of discrete inner electrodes 20, 25, 30, 35. The piezoelectric transducer 100 includes two areas composed of first piezoelectric ceramic layers 230 and second piezoelectric ceramic layers 240. The second piezoelectric ceramic layers 240 are located near the ink channels 50 and deformed by a transversal effect, and the first piezoelectric ceramic layers 230 are located on the opposite side of the second piezoelectric ceramic layers 240 from the ink channels 50 and deformed by a longitudinal effect.

The inner electrodes 20, 25, 30, 35 are distinguished from each other by their positions in the array direction (in the right-left direction in FIG. 1). First electrodes provided in the first piezoelectric ceramic layers 230 include positive electrodes 25 aligned with the center of each ink channel 30 and negative electrodes 20 spaced from the positive electrodes in a direction perpendicular to the ceramic layer laminating direction and aligned with each partition wall 51. Each partition wall 51 separates two adjacent ink channels 50. The positive electrodes 25 and the negative electrodes 20 are sandwiched between adjacent ceramic layers, in a staggered configuration. Second electrodes provided in the second piezoelectric ceramic layers 240 include negative electrodes 30 and positive electrodes 35, which are aligned in the laminating direction with each ink channel and sandwiched alternately between adjacent ceramic layers. In the first piezoelectric ceramic layers 230, two columns of negative electrodes 20 and a column of positive electrodes 25 correspond to each ink channel 50, as a set (pattern). In the second piezoelectric ceramic layers 240, a column of positive and negative electrodes 30, 35 corresponds to each ink channel 50, as a set. A column of negative electrodes 20 aligned with each partition wall 51 is commonly used as part of two sets of positive and negative electrodes 20, 25, 20 that correspond two adjacent ink channels. Column as used herein means electrodes stacked one above another as shown in FIG. 1.

Each piezoelectric ceramic layer 10 measures 0.015 mm in thickness. In the second piezoelectric ceramic layers 240, five piezoelectric ceramic layers are laminated while sandwiching negative and positive electrodes 30, 35 alternately therebetween. In the first piezoelectric ceramic layers 230, six piezoelectric ceramic layers are laminated while sandwiching negative and positive electrodes 20, 25 alternately therebetween. One piezoelectric ceramic layer 10 is commonly used as the top layer of the second piezoelectric ceramic layers 240 and as the bottom layer of the first piezoelectric ceramic layers 230. Thus, a total of 10 ceramic layers are laminated to form the piezoelectric transducer 100 having a thickness of about 0.150 mm. The bottom layer of the second piezoelectric ceramic layers 240 serves as an insulating layer and insulates the negative electrodes 30 provided thereon from the ink in the ink channels 50. Thus, the negative electrodes 30 are prevented from corroding.

The inner electrodes 20, 25, 30, 35 are made of an electrically conductive metal of Ag—Pd group and measure about 0.002 mm in thickness. The electrodes 30, 35 measure about 0.350 mm in width (in the right-left direction in FIG. 1) while the electrodes 20, 25 measure about 0.150 mm in width.

Two areas defined by electrodes 25 at the center and electrodes 20 on both sides thereof in the first piezoelectric ceramic layers 230 are polarized parallel to the array direction, as indicated by solid arrows 210. The two areas are polarized in opposite directions symmetrically with respect to the electrodes 25 at the center. In the second piezoelectric ceramic layers 240, each area between electrodes 30, 35 is polarized parallel to the laminating direction, as indicated by solid arrows 220.

Figure 2:
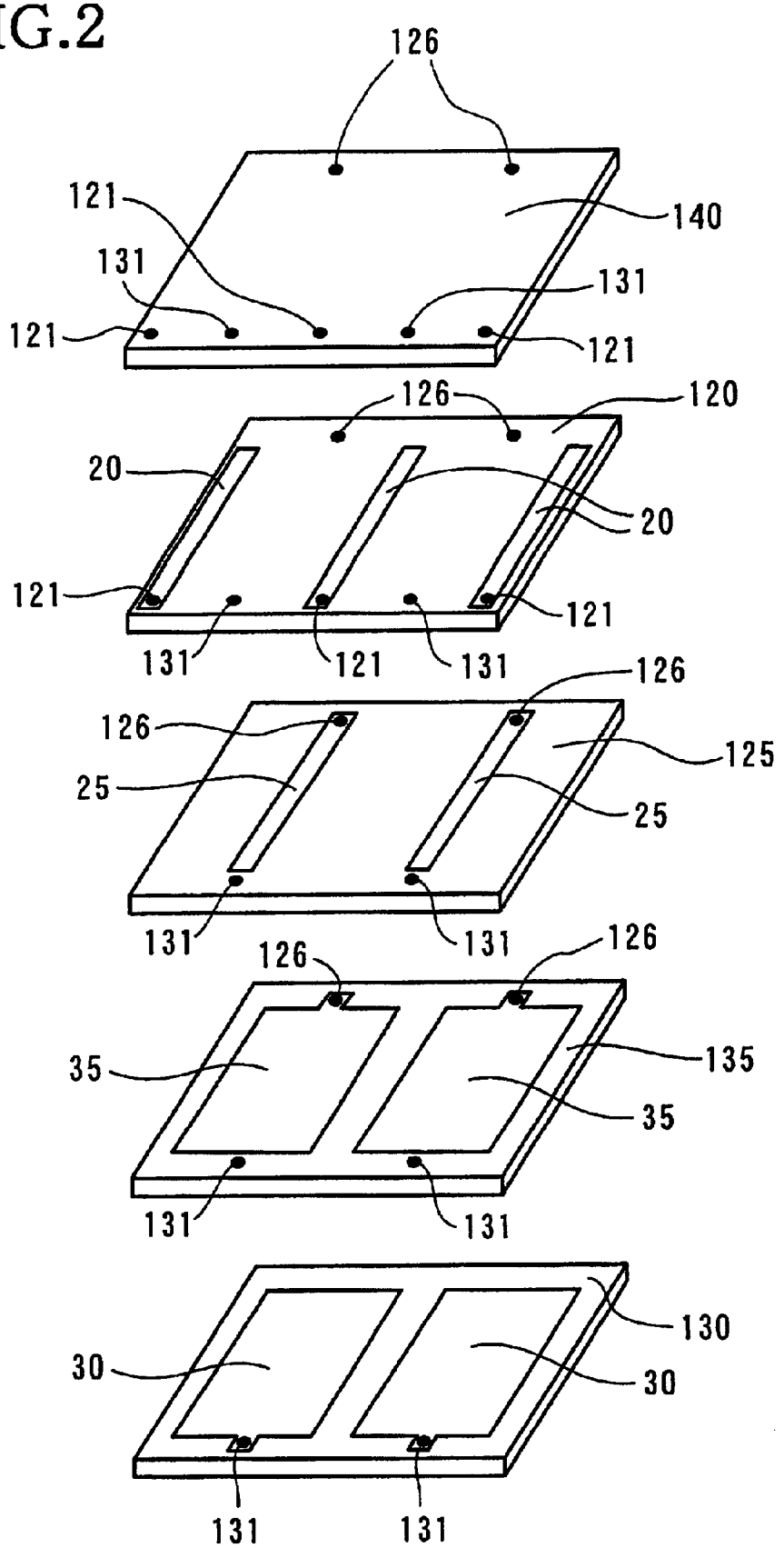
FIG. 2 is a perspective view of ceramic green sheets laminated in a manufacturing process of a piezoelectric transducer used for the ink ejector.

The piezoelectric transducer 100 is manufactured as described below. As shown in FIG. 2, discrete inner electrodes 20, 25, 30, 35 are formed on the upper surface of green sheets 120, 125, 130, 135, respectively, by screen-printing. The necessary number of green sheets 120, 125, 130, 135 with electrodes are prepared. Green sheets 130, 135, 130, 135, 125, 120, 125, 120, and 125 with electrodes are laminated in this order from the bottom (not all green sheets are shown in FIG. 2, only representative green sheets; see FIG. 1 for all green sheets). Then, a green sheet 140 without electrodes is placed on the top of the lamination. Through-holes 121, 126, 131 are formed by laser machining through the green sheets, except for the bottom green sheet, in the laminating direction and filled with an electrically conductive metal of Ag—Pd group such that all the inner electrodes 20, 25, 30, 35 are lead out to the upper surface of the uppermost green sheet 140. The through-holes 121 are electrically connected to the negative electrodes 20, the through-holes 126 are electrically connected to the positive electrodes 25, 35, and the through-holes 131 are electrically connected to the negative electrodes 30.

Figure 3:
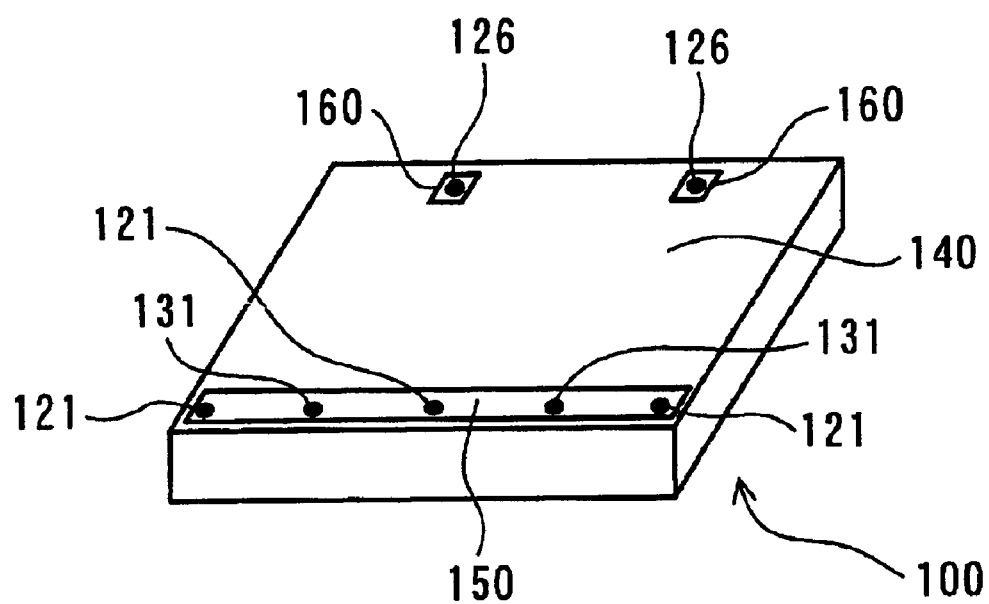
FIG. 3 is a perspective view of piezoelectric layers laminated and sintered in the manufacturing process of the piezoelectric transducer.
Figure 4:
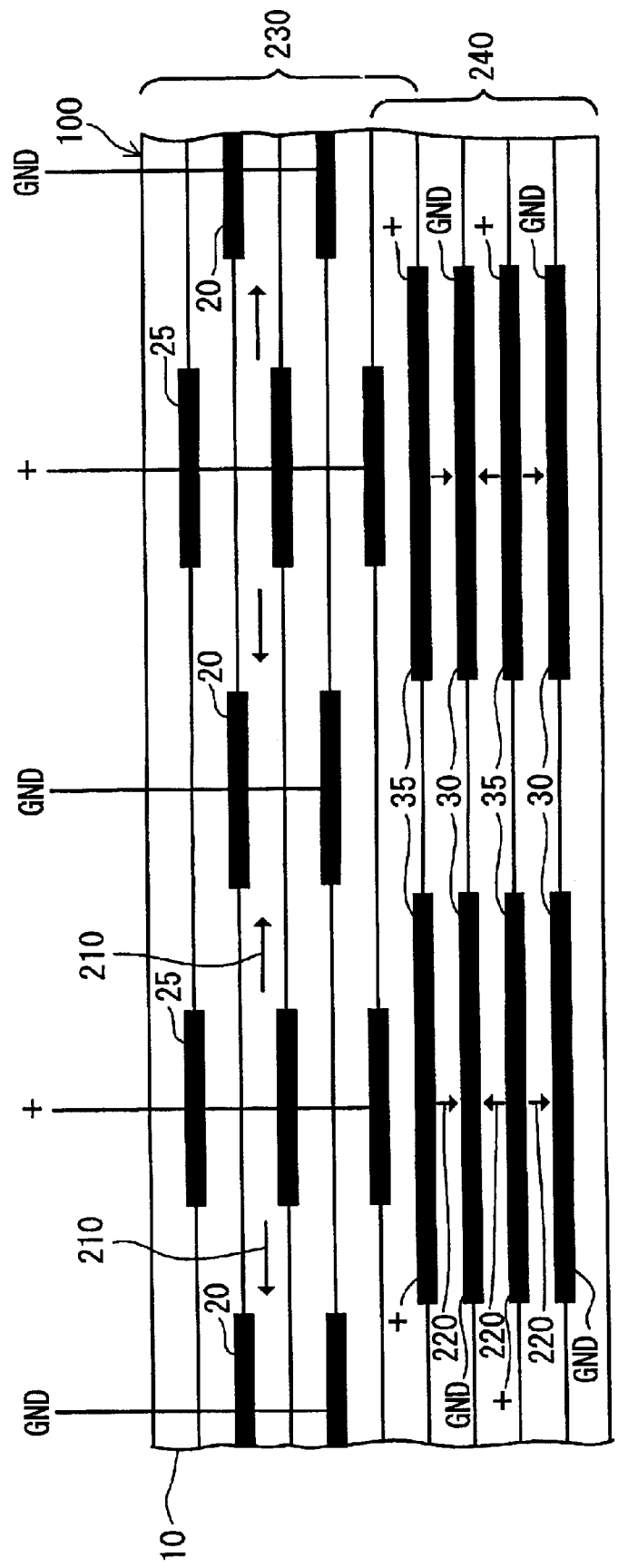
FIG. 4 is a cross-sectional view showing polarization in the manufacturing process of the piezoelectric transducer.

Thereafter, the laminated green sheets with electrodes are thermally pressed and, as is well known, degreased and sintered. Then, as shown in FIG. 3, an outer common electrode 150, which is electrically connected to the through-holes 121, 131 exposed to the upper surface, and outer positive electrodes 160, which are electrically connected to the through-holes 126, are formed by screen-printing, spattering, or other methods. As a result, the piezoelectric transducer 100 is obtained.

The piezoelectric transducer 100 thus obtained is then immersed in an oil bath (not shown) filled with an insulating oil, such as a silicon oil, heated to a temperature of about 130° C., and an electric field of about 2.5 kV/mm is applied by a polarizing power source (not shown) between the outer positive electrodes 160 and the outer common electrode 150 to perform polarization. At this time, the negative electrodes 20, 30, which are electrically connected to the outer common electrode 150 via the though holes 121, 131, respectively, are grounded as a polarizing voltage is applied to the positive electrodes 25, 35, which are electrically connected via the through-holes 126. As a result of such polarization, two areas defined by electrodes 25 at the center and electrodes 20 on both sides thereof in the first piezoelectric ceramic layers 230 are polarized parallel to the array direction and symmetrically with respect to the electrodes 25 at the center, as indicated by solid arrows 210. In the second piezoelectric ceramic layers 240, each area between electrodes 30, 35 is polarized parallel to the laminating direction, as indicated by solid arrows 220.

By integrally assembling the ink channel forming member 60, the spacer member 70, and the nozzle plate 90 into the piezoelectric transducer 100 thus obtained, an ink ejector 200, shown in FIG. 1, is constructed.

The operation of the ink ejector 200 thus structured will be described. An electric circuit used for polarization, including the outer positive electrodes 160 and the outer common electrode 150, is also used as a drive circuit for ink ejection. As shown in FIG. 1, all the inner electrodes 20, 25, 30, 35 are grounded and the ink channels 50 are filled with ink in the initial state.

Figure 5:
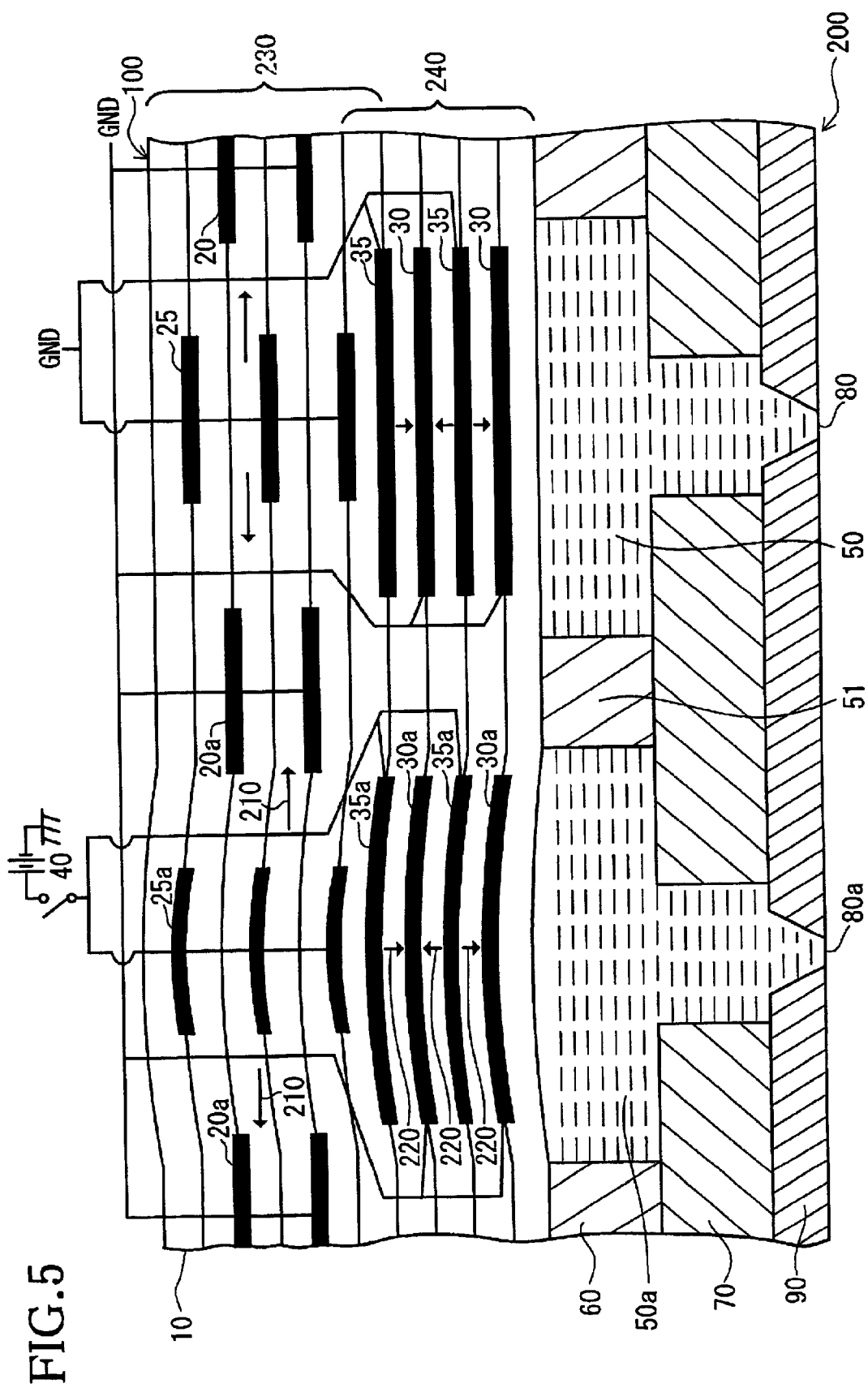
FIG. 5 illustrates the operation of the ink ejector where a portion of the piezoelectric transducer is locally deformed.

When an ink droplet is ejected (FIGS. 5 and 6) from a nozzle 80a connected to a selected ink channel 50a according to a predetermined print data, a power source 40 applies a drive voltage (of 15 V, for example), via the outer positive electrodes 160, to positive electrodes 25a in the first piezoelectric ceramic layers 230 and positive electrodes 35a in the second piezoelectric ceramic layers 240, as shown in FIG. 5. At this time, electric fields are generated in two areas, defined by electrodes 25a at the center and negative electrodes 20a on both sides thereof, in the polarization directions indicated by the solid arrows 210. At the same time, an electric field is generated in each area between positive and negative electrodes 35a, 30a in the polarization direction indicated by the solid arrow 220. The positive electrodes 25a, the negative electrodes 20a, 20a, the positive electrodes 35a, and the negative electrodes 30a correspond to the ink channel 50a.

As a result, a portion of the first piezoelectric ceramic layers 230 corresponding to the ink channel 50a is locally deformed to extend in the array direction by a piezoelectric and electrostrictive longitudinal effect. A portion of the second piezoelectric ceramic layers 240 corresponding to the ink channel 50a is locally deformed to contract in the array direction by a piezoelectric and electrostrictive transversal effect. The second piezoelectric layers 240 near the ink channel 50a contract in the array direction while the first piezoelectric layers 230 remote from the ink channel 50a extend in the array direction. Consequently, a bimorph deformation occurs in a portion of the piezoelectric transducer 100 corresponding to the ink channel 50a and the volume of the ink channel 50a is increased, as shown in FIG. 5. At this time, the pressure in the ink channel 50a is reduced. By maintaining such a state for a period of time T required for a pressure wave generated to propagate along the ink channel 50a, ink is supplied from the ink supply source (not shown).

The one-way propagation time T represents a time required for a pressure wave in the ink channel 50a to propagate longitudinally (in a direction perpendicular to the sheet of FIG. 5) along the ink channel 50a, and is given by an expression T=L/Z, where L is a length of the ink channel 50a and Z is a speed of sound in the ink in the ink channel 50a.

Figure 6:
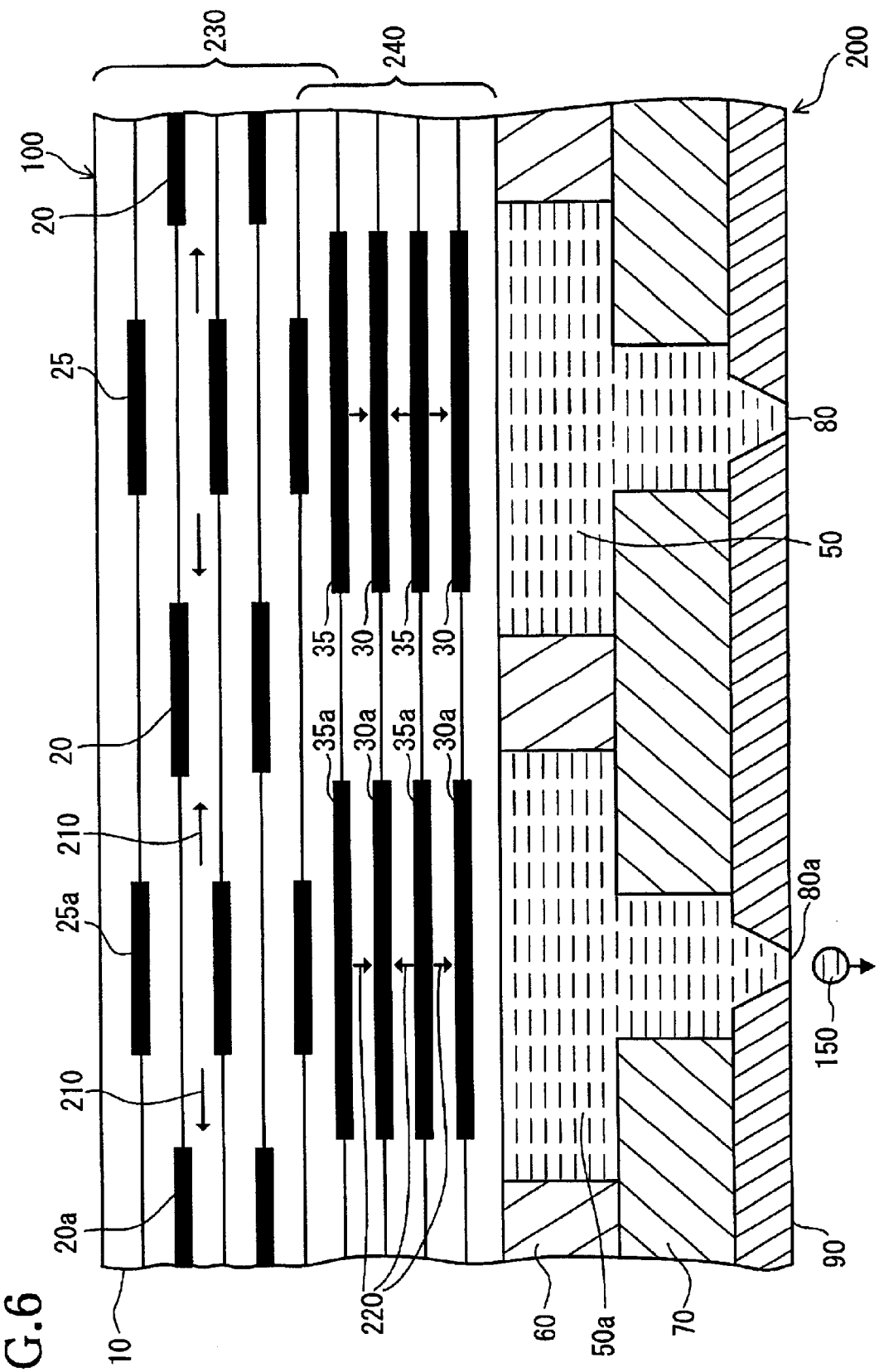
FIG. 6 illustrates the operation of the ink ejector where an ink droplet is ejected.
Figure 7:
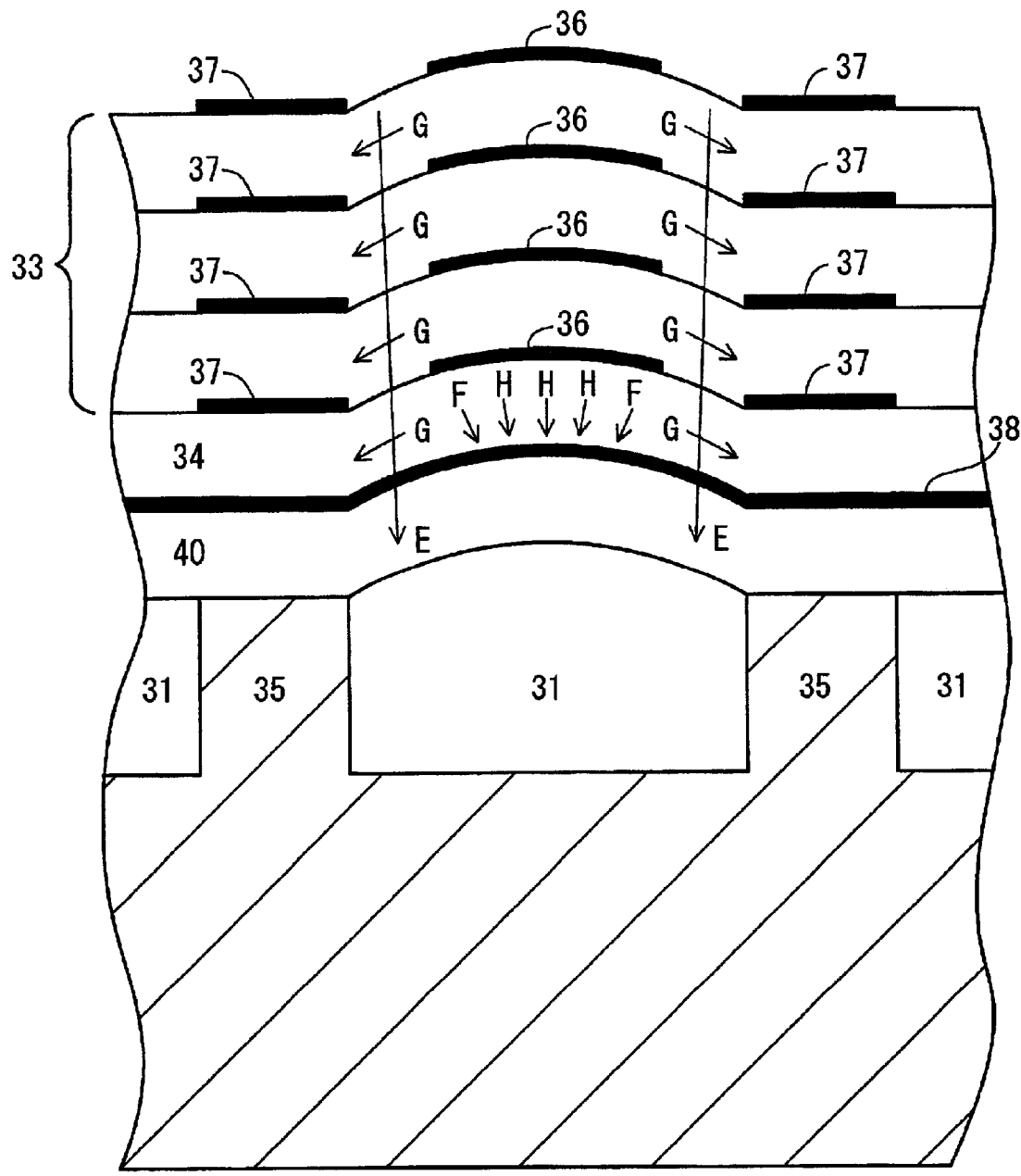
FIG. 7 is a cross-sectional view of a conventional ink ejector.

According to the theory of propagation of a pressure wave, when the time T has expired after the application of the drive voltage, the pressure in the ink channel 50a is reversed to a positive pressure. Concurrently with the reversing of the pressure, the voltage applied to the positive electrodes 25a, 35a is reset to 0 V. Consequently, as shown in FIG. 6, the piezoelectric transducer 100 returns to its non-deformed original state and pressurizes the ink in the ink channel 50a. At this time, the pressure reversed to a positive pressure is combined with the pressure generated upon returning of the piezoelectric transducer 100, and a relatively high pressure is generated in the vicinity of the nozzle 80a of the ink channel 50a. As a result, a larger ink droplet 150 is ejected than in the case where an ink droplet is ejected by simply reducing the volume of an ink channel without drawing the ink.

In the ink ejector 200 in the above-described embodiment, at least an area deformable by a longitudinal effect and at least an area deformable by a transversal effect upon the application of a drive voltage are stacked corresponding to each ink channel 50. Upon the application of a drive voltage, the area deformable by a longitudinal effect extends in the array direction while the area deformable by a transversal effect contracts in the array direction. Such a bimorph deformation effectively changes the volume of the ink channel 50. Accordingly, the required drive voltage can be reduced.

In addition, the area deformable by a transversal effect is placed more closely to the ink channel 50 than the area deformable by a longitudinal effect. Accordingly, upon the application of the drive voltage, the area deformable by a transversal effect and close to the ink channel 50 contracts in the array direction, while the area deformable by a longitudinal effect and remote from the ink channel 50 extends in the array direction. Such a bimorph deformation increases the volume of the ink channel 50. Thus, ink is drawn to the ink channel 50 and a large ink droplet is ejected at high speed.

Actually, in the above-described embodiment, a plurality of areas deformable by a transversal effect and collectively two areas deformable by a longitudinal effect are provided for each ink channel 50. The plurality of areas deformable by a transversal effect and the two areas deformable by a longitudinal effect are placed symmetrically with respect to the center of the ink channel 50. Upon the application of the drive voltage, the two areas extend symmetrically in the array direction while the plurality of areas deformable by a transversal effect contract in the array direction. Such a bimorph deformation more effectively changes the volume of the ink channel.

In addition, upon the application of the drive voltage, an electric field is generated in the polarization direction in each of the area deformable by a longitudinal effect and the area deformable by a transversal effect. Because the polarization direction and the electric field generating direction are identical, the polarization property of the piezoelectric transducer 100 is unlikely to deteriorate even by repeatedly applying a drive voltage for ink ejection. Accordingly, the durability of the piezoelectric transducer 100 is enhanced, and stable deformation of the piezoelectric transducer 100 as well as accurate ink ejection in the ink ejector 200 are ensured for a long time.

Further, in the above-described embodiment, an electric circuit used for polarization is also used as a drive circuit for ink ejection. Thus, the manufacturing cost of the ink ejector 200 is reduced.

In an alternate embodiment, the width of an ink channel in the array direction, the pitch of ink channels, the number of laminated piezoelectric ceramic layers, and the width and position of each inner electrode can be changed as required. Although, in the above-described embodiment, the negative electrodes 30 provided in the second piezoelectric ceramic layers 240 are divided corresponding to the ink channels 50, undivided negative electrodes 30 may be provided to extend in the array direction. Although, in the above-described embodiment, the negative electrodes 20 and the positive electrodes 25 are provided on alternate surfaces of the first piezoelectric ceramic layers 230, the negative and positive electrodes 20, 25 may be provided on the same surfaces. The negative and positive electrodes 20, 25 provided on alternate surfaces can prevent an electrical breakdown from occurring when a high voltage is applied therebetween to perform polarization.

The electrodes 25 may be omitted from the first piezoelectric ceramic layers 230 and an electric field is applied between the opposed electrodes 20, 20 to deform an area therebetween by a longitudinal effect. In this case, the electrodes 20 aligned with each partition wall 50 are preferably divided at the center, instead of being shared by two adjacent ink channels 50, 50.

While the invention has been described with reference to the specific embodiment, the description of the embodiment is illustrative only and is not to be construed as limiting the scope of the invention. Various other modifications and changes may be occur to those skilled in the art without departing from the spirit and scope of the invention.

What is claimed is:

1. A piezoelectric transducer, comprising:
    a first piezoelectric ceramic layer;
    a second piezoelectric ceramic layer laminated to the first piezoelectric layer;
    a first electrodes set including a plurality of electrodes spaced along the first piezoelectric ceramic layer perpendicularly to a laminating direction of the first and second piezoelectric ceramic layers, the first electrodes set defining therebetween at least a first area polarized perpendicularly to the laminating direction; and
    a second electrodes set including a plurality of electrodes positioned in the second piezoelectric ceramic layer in the laminating direction, the second electrodes set defining at least a second area polarized parallel to the laminating direction, the at least a second area being aligned in the laminating direction with the at least a first area, wherein upon application of a voltage to the first electrodes set and to the second electrodes set, an electric field is generated in the polarization direction in each of the at least a first area and the at least a second area to cause the at least a first area to extend by a longitudinal effect perpendicularly to the laminating direction and the at least a second area to contract by a transversal effect perpendicularly to the laminating direction.

2. The piezoelectric transducer according to claim 1, wherein the first piezoelectric ceramic layer includes a plurality of laminated first sheets, and the second piezoelectric ceramic layer includes a plurality of laminated second sheets, each electrode in the first electrodes set being sandwiched between adjacent first sheets, and each electrode in the second electrodes set being sandwiched between adjacent second sheets.

3. The piezoelectric transducer according to claim 2, wherein the plurality of electrodes in the first electrodes set are sandwiched between adjacent first sheets in a staggered configuration.

4. The piezoelectric transducer according to claim 3, wherein the plurality of electrodes in the first electrodes set are also provided in the laminating direction, and first electrodes provided in the laminating direction are sandwiched between adjacent first sheets and aligned with each other.

5. The piezoelectric transducer according to claim 2, wherein the piezoelectric transducer has an outer surface having a plurality of electric terminals and extending perpendicularly to a laminating direction of the first and second sheets, and a through-hole is formed through one or more sheets sandwiched, among the plurality of first and second sheets, between each electrode in the first and second electrodes sets and the outer surface, and each electrode is electrically connected to corresponding one of the plurality of electric terminals, via a conductive material filling the through-hole.

6. The piezoelectric transducer according to claim 1, wherein the first electrodes set includes a central electrode and two side electrodes, and the central electrode and the two side electrodes define two first areas, the two first areas placed symmetrically with respect to the central electrode and aligned with the at least a second area.

7. The piezoelectric transducer according to claim 6, wherein the two first areas are polarized in opposite directions symmetrically with respect to the central electrode.

8. An ink ejector, comprising:
    an ink channel forming member having partition walls that define ink channels filled with ink;
    a nozzle connected to a corresponding one of the ink channels; and
    a piezoelectric transducer extending across the ink channels, the piezoelectric transducer including:
        a first piezoelectric ceramic layer;
        a second piezoelectric ceramic layer laminated to the first piezoelectric layer;
        a first electrodes set, for each ink channel, including a plurality of electrodes spaced along the first piezoelectric ceramic layer perpendicularly to a laminating direction of the first and second piezoelectric ceramic layers, the first electrodes set defining therebetween at least a first area polarized perpendicularly to the laminating direction; and
        a second electrodes set, for each ink channel, including a plurality of electrodes positioned in the second piezoelectric ceramic layer in the laminating direction, the second electrodes set defining at least a second area polarized parallel to the laminating direction, the at least a second area being aligned in the laminating direction with the at least a first area, wherein the at least a first area in the first piezoelectric ceramic layer and the at least a second area in the second piezoelectric ceramic layer are aligned with each ink channel, and upon application of a voltage to electrodes, of the first and second electrodes sets, corresponding to a selected ink channel, an electric field is generated in the polarization direction in each of the at least a first area and the at least a second area, and the at least a first area extends by a longitudinal effect perpendicularly to the laminating direction and the at least a second area contracts by a transversal effect perpendicularly to the laminating direction, thereby changing a volume of the selected ink channel to cause ink ejection from the nozzle of the selected ink channel.

9. The ink ejector according to claim 8, wherein the first piezoelectric ceramic layer includes a plurality of laminated first sheets, and the second piezoelectric ceramic layer includes a plurality of laminated second sheets, each electrode in the first electrodes set being sandwiched between adjacent first sheets, and each electrode in the second electrodes set being sandwiched between adjacent second sheets.

10. The ink ejector according to claim 9, wherein the plurality of electrodes in the first electrodes set are sandwiched between adjacent first sheets in a staggered configuration.

11. The ink ejector according to claim 10, wherein the plurality of electrodes in the first electrodes set are also provided in the laminating direction, and first electrodes provided in laminating direction are sandwiched between adjacent first sheets and aligned with each other.

12. The ink ejector according to claim 9, wherein the piezoelectric transducer has an outer surface having a plurality of electric terminals and extending perpendicularly to a laminating direction of the first and second sheets, and a through-hole is formed through one or more sheets sandwiched, among the plurality of first and second sheets, between each electrode in the first and second electrodes sets and the outer surface, and each electrode is electrically connected to corresponding one of the plurality of electric terminals, via a conductive material filling the through-hole.

13. The ink ejector according to claim 8, wherein the first electrodes set includes a central electrode and two side electrodes, and the central electrode and the two side electrodes define two first areas, the two first areas and the at least a second area placed symmetrically with respect to a center of a corresponding ink channel.

14. The ink ejector according to claim 13, wherein the two first areas are polarized in opposite directions symmetrically with respect to the central electrode.

15. The ink ejector according to claim 13, the two side electrodes of the first electrodes set are aligned with a corresponding two partition walls defining an ink channel.

16. The ink ejector according to claim 15, wherein one of the two side electrodes of the first electrodes set is commonly used as one of the two side electrodes in an adjacent first electrodes set, and the three side electrodes are aligned with a corresponding three partition walls that define two adjacent ink channels.

17. The ink ejector according to claim 8, wherein the second piezoelectric ceramic layer faces the ink channels while the first piezoelectric ceramic layer is placed at an opposite side of the second piezoelectric ceramic layer from the ink channels.

18. The ink ejector according to claim 8, wherein the piezoelectric transducer further includes an insulating sheet that covers the ink channels to insulate the first and second electrodes sets from the ink in the ink channels.

19. An ink ejector, comprising:
an ink channel forming member having partition walls that define ink channels;
a nozzle connected to a corresponding one of the ink channels; and
a piezoelectric transducer extending across the ink channels, the piezoelectric transducer including:
a first piezoelectric layer having, corresponding to each ink channel, a pattern of two spaced first electrodes aligned with two partition walls defining each ink channel and a second electrode centered over each ink channel; and
a second piezoelectric layer having, corresponding to each ink channel, a third electrode and a fourth electrode that extend over each ink channel, the first and second piezoelectric layers being laminated over the ink channels, wherein first areas defined between each of the first electrodes and the second electrode of each pattern are polarized perpendicular to the laminating direction, and a second area defined between the third and fourth electrodes is polarized parallel to the laminating direction, and upon application of a voltage to the first electrodes and the second electrode and to the third and fourth electrodes, an electric field is generated in the polarization direction in each of the first areas and in the second area, and each of the first areas extends perpendicularly to the laminating direction and the second area contracts perpendicularly to the laminating direction, thereby changing a volume of a corresponding ink channel.

20. The ink ejector according to claim 19, wherein the first piezoelectric layer includes a plurality of laminated first piezoelectric sheets, each having, for a pattern corresponding to each ink channel, at least one of the two spaced first electrodes and the second electrode, and the second piezoelectric layer includes a plurality of laminated second piezoelectric sheets, each having, corresponding to each ink channel, one of the third and fourth electrode.

21. The ink ejector according to claim 20, wherein the piezoelectric transducer further includes an additional sheet, and an outer surface of the additional sheet extends perpendicularly to the laminating direction and has a plurality of electric terminals, and wherein a through-hole is formed through one or more sheets sandwiched, among the plurality of first and second sheets, between each of the first, second, third, and fourth electrodes and the outer surface, and each of the first, second, third, and fourth electrodes is electrically connected to corresponding one of the plurality of electric terminals, via a conductive material filling the through-hole.

22. An ink ejector, comprising:
a nozzle member having at least one nozzle and an ink channel between adjacent partition walls associated with each nozzle;
a first piezoelectric layer; and
a second piezoelectric layer lying between the nozzle member and the first piezoelectric layer, wherein the first piezoelectric layer has a first pattern of electrodes, including a first set of electrodes and a second set of electrodes for each ink channel, the first and second sets arranged perpendicularly to a laminating direction of the nozzle member, second piezoelectric layer, and first piezoelectric layer and the second piezoelectric layer has a second pattern of electrodes for each ink channel aligned in the laminating direction, the first piezoelectric layer comprises a first plurality of sheets and the second piezoelectric layer comprises a second plurality of sheets.

23. The ink ejector according to claim 22, wherein the first pattern of electrodes comprises two first electrodes and one second electrode, a first electrode aligned with each partition wall of the ink channel associated with each nozzle, and the second electrode aligned with the ink channel.

24. The ink ejector according to claim 23, wherein the first electrodes are on a first sheet of the first piezoelectric layer and the second electrode is on a second sheet.

25. The ink ejector according to claim 23, wherein the second pattern of electrodes comprises a third electrode on a first sheet of the second piezoelectric layer and a fourth electrode on a second sheet of the second piezoelectric layer.

26. The ink ejector according to claim 25, wherein the second, third and fourth electrodes are aligned with the ink channel.

27. The ink ejector according to claim 25, wherein a top sheet of the first piezoelectric layer comprises a fifth electrode extending along one edge and a sixth electrode associated with each ink channel along an opposing edge, the first and second piezoelectric layers having a plurality of through-holes extending therethrough and filled with a conductive material, the fifth electrode electrically connected to the first and fourth electrodes by through-holes and the sixth electrode electrically connected to the second and third electrodes by through-holes.

28. The ink ejector according to claim 27, wherein when a positive electric charge is applied to the sixth electrode, and thence to the second and third electrodes and a negative charge is applied to the fifth electrode, and thence to the first and fourth electrodes, resultant electric fields cause the first piezoelectric layer to expand by a longitudinal effect perpendicularly to the laminating direction and the second piezoelectric layer to contract by a transversal effect perpendicularly to the laminating direction.

29. The ink ejector according to claim 23, wherein the first piezoelectric layer is polarized in directions perpendicular to the laminating direction, the directions of polarization centered on the second electrode and toward the first electrodes.

30. The ink ejector according to claim 29, wherein the second piezoelectric layer is polarized in directions parallel to the laminating direction.

31. The ink ejector according to claim 23, wherein the first electrodes make up the first set of electrodes and the second electrodes make up the second set of electrodes.

32. The ink ejector according to claim 22, wherein a bottom sheet of the first piezoelectric layer is a top sheet of the second piezoelectric layer.

33. The ink ejector according to claim 22, wherein a bottom sheet of the second piezoelectric layer is attached to the nozzle member.

34. The ink ejector according to claim 33, wherein the nozzle member comprises:

a nozzle plate having a plurality of nozzles that comprise the at least one nozzle;

a spacer member mounted to the nozzle plate and having a connecting hole aligned with each nozzle; and an ink channel forming member mounted to the spacer member, the ink channel member having the ink channel between adjacent partition walls associated with each nozzle.

* * * * *